(12) United States Patent
Natsume

(10) Patent No.: US 6,845,490 B2
(45) Date of Patent: Jan. 18, 2005

(54) CLOCK SWITCHING CIRCUITRY FOR JITTER REDUCTION

(75) Inventor: Kenichi Natsume, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/252,087

(22) Filed: Sep. 23, 2002

(65) Prior Publication Data

US 2003/0132783 A1 Jul. 17, 2003

(30) Foreign Application Priority Data

Jan. 11, 2002 (JP) .......................................... 2002-004067

(51) Int. Cl.⁷ .......................... G06F 17/50; H03K 17/00
(52) U.S. Cl. .................................. 716/1; 327/99; 716/6
(58) Field of Search ............. 716/1, 2–15; 327/99–147, 327/158, 157, 292, 175; 713/503

(56) References Cited

U.S. PATENT DOCUMENTS

| 5,448,597 | A | * | 9/1995 | Hashimoto ................. 375/354 |
|---|---|---|---|---|
| 5,502,409 | A | * | 3/1996 | Schnizlein et al. ............ 327/99 |
| 5,828,255 | A | * | 10/1998 | Kelkar et al. ................ 327/157 |
| 5,872,789 | A | * | 2/1999 | Orleth et al. ................ 370/517 |
| 5,926,044 | A |   | 7/1999 | Niimura |
| 6,081,905 | A | * | 6/2000 | Larsson et al. ............. 713/503 |
| 6,157,694 | A | * | 12/2000 | Larsson ....................... 377/48 |
| 6,310,498 | B1 | * | 10/2001 | Larsson ...................... 327/158 |
| 6,356,129 | B1 | * | 3/2002 | O'Brien et al. ............. 327/175 |
| 6,456,165 | B1 | * | 9/2002 | Kelkar ......................... 331/17 |
| 6,600,345 | B1 | * | 7/2003 | Boutaud ....................... 327/99 |
| 2003/0024984 | A1 | * | 2/2003 | Yamasaki ................... 235/451 |
| 2003/0052722 | A1 | * | 3/2003 | Kitahara ..................... 327/292 |
| 2003/0067331 | A1 | * | 4/2003 | Drexler ...................... 327/158 |

FOREIGN PATENT DOCUMENTS

| JP | 2-183621 | 7/1990 |
|---|---|---|
| JP | 8316797 | 11/1996 |
| JP | 2001-148161 | 5/2001 |

* cited by examiner

Primary Examiner—Leigh M. Garbowski
Assistant Examiner—Magid Y. Dimyan
(74) Attorney, Agent, or Firm—Volentine Francos & Whitt, P.L.L.C.

(57) ABSTRACT

Clock switching circuitry includes a clock switching control circuit for temporarily storing a clock select signal, which is input from the outside for selecting one of a plurality of clock signals different in phase from each other. The clock switching control circuit then outputs the clock select signal in accordance with the change in the level of a timing signal that switches the clock signals. A clock output circuit outputs one of the clock signals selected in accordance with the clock select signal. A masking circuit generates the timing signal while masking it to a preselected level by taking account of changes in the levels of the clock signals.

4 Claims, 9 Drawing Sheets

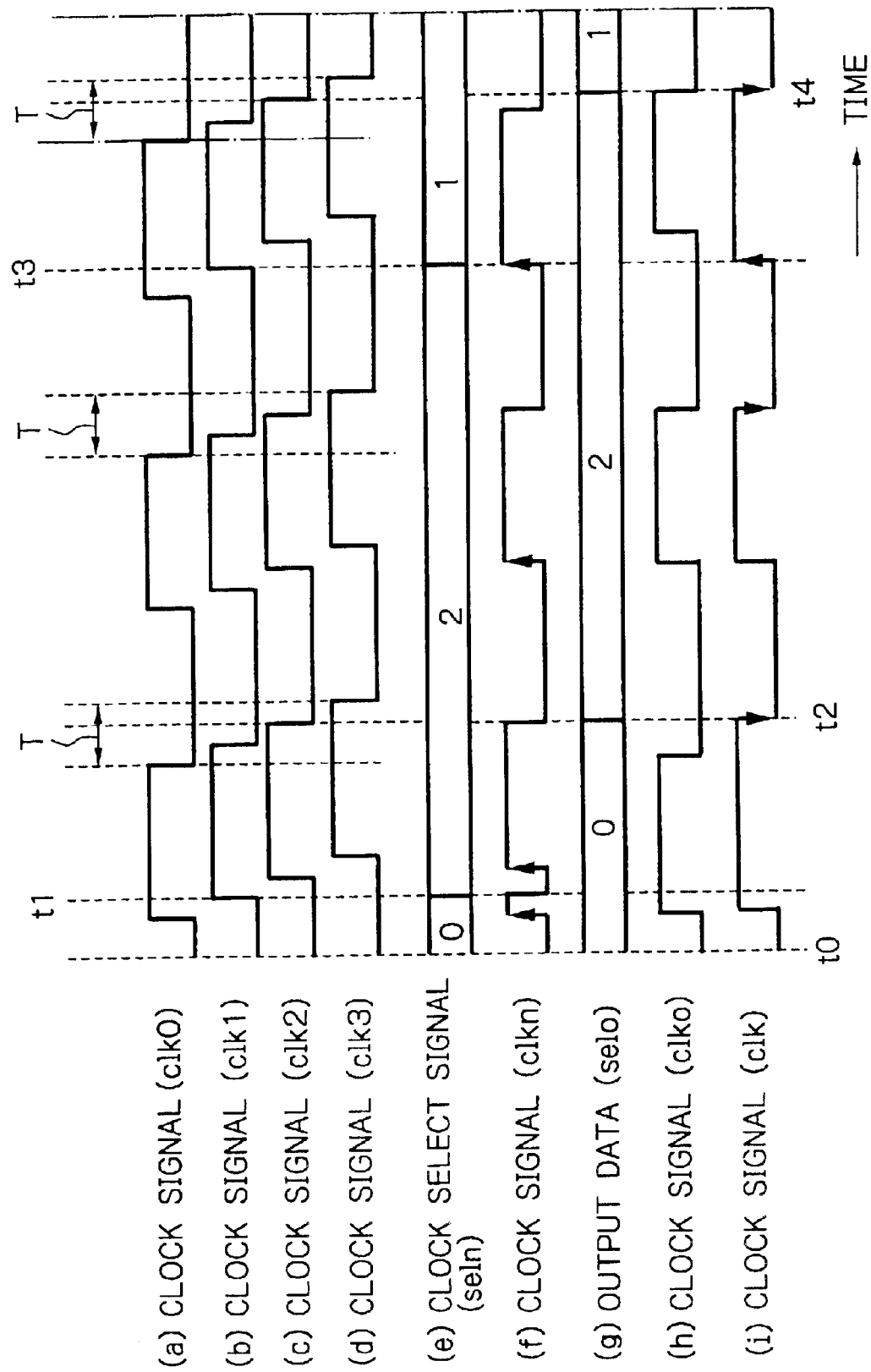

CLOCK SWITCHING CIRCUITRY FOR JITTER REDUCTION

BACKGROUND OF THE INVENTION

1. Field of the Invention

The present invention relates to clock switching circuitry for switching clock signals different in phase from each other for thereby reducing jitter. More particularly, the present invention relates to clock switching circuitry applicable to, e.g., a receiver for receiving data input from the outside or a reproducing device for reading out data from a recording medium and reproducing the data.

2. Description of the Background Art

It is a common practice with, e.g., a receiver included in a transmission system or a video reproducing device to sample input data with a clock signal particular to the receiver or device and reproduce a signal from the sampled data. The input data involves phase errors, or jitter, with respect to a bilevel reference signal. To cope with the phase errors, the receiver or device mentioned above usually includes clock switching circuitry.

The clock switching circuitry switches a clock select signal in accordance with the phase error or jitter of the individual clock for thereby feeding a sampling circuit with a clock signal selected such that the sampling circuit can accurately sample data. A problem with the conventional clock switching circuitry is that when the switchover of the clock select signal is not coincident with the positive-going edge of the clock signal selected, the clock signal is apt to go high two consecutive times for a single data. The sampling circuit, when received the clock signal gone high two times for a single data, samples single data two consecutive times, as may be referred to as double sampling. As a result, in a device or a system including the clock switching circuitry, it is likely that the input data fails to match, e.g., a preselected format and is erroneously fed.

The data not matching the preselected format cannot be correctly processed at the time of reproduction. This brings about malfunction or causes a resend command to be transmitted to a source station due to error detection. Processing necessary for avoiding such errors ascribable to the clock switching circuitry critically lowers the processing ability of the device or the system.

Moreover, the sampled data is synchronous to the sampling clock signal generated by the clock switching circuitry and is therefore used in the device or the system as well. Consequently, the clock signal erroneously including two consecutive pulses for single data prevents a synchronizing circuit included in the device or the system from operating at an expected timing and causes it to malfunction.

In light of the above, the conventional clock switching circuitry includes a first and a second clock selector with a clock selecting function, a register with a synchronous enabling function and a switching clock enable generator that are configured to switch the clock signal while accurately following phase errors. To the clock switching circuitry, a clock generator is connected for feeding beforehand a plurality of clock signals different in phase from each other. Also, to the select terminal of the first clock selector of the clock switching circuitry and the input terminal of the register, clock select data is delivered from a clock select signal generator.

The clock generator includes a PLL (Phase Locked Loop) circuit for generating a high-speed clock signal higher in clock rate than the plurality of clock signals described above. The high-speed clock signal is generated in such a manner that each of the plurality of clock signals is provided with a phase error that is equal to an integral multiple of one period of the high-speed clock signal.

The first clock selector delivers one of the clock signals designated by the clock select signal to the switching clock enable generator. The register feeds the second clock selector with a phase-corrected select signal. The second clock selector delivers a sampling clock to a sampling circuit or flip-flop circuit and the switching clock enable generator in response to the phase-corrected select signal. The switching clock enable generator detects the switching timing of the clock signals fed from the first and second clock selectors. The switching clock enable generator then feeds the register with an enable signal such that the register stores, after the above timing, data fed thereto as a clock select signal. During the enable period of the enable signal, the register samples the data at the first positive-going edge of the high-speed clock signal and delivers corrected, selected data to the second clock selector.

With the above configuration, the clock switching circuitry feeds the waveform of one clock signal corresponding to the data, which is input to the second clock selector, to the flip-flop circuit as a sampling clock signal. By sampling input data with the sampling clock signal, the flip-flop circuit surely samples the data while correcting phase errors. At the same time, the device or the system using the sampling clock as its system clock operates in a stable manner. The conventional clock switching circuitry will be described more specifically.

The conventional clock switching circuitry generates the enable signal in response to the high-speed clock signal input from the outside and the switchover of the clock, as stated above. This allows the device or the system including such a clock switching circuitry to perform flexible operation, including data sampling, with phase errors being adjusted in synchronism with the timing of the high-speed clock signal. The clock switching circuitry, however, needs a number of parts for reducing jitter. Further, the clock generator must be configured to output the high-speed clock signal higher in speed than the clock signals having phase errors. Consequently, the clock switching circuitry and therefore the entire device or system using it is bulky.

SUMMARY OF THE INVENTION

It is an object of the present invention to provide clock switching circuitry capable of outputting an accurate sampling clock signal by reducing jitter with a minimum number of structural parts or a minimum of improvement.

In accordance with the present invention, clock switching circuitry includes a clock switching control circuit for temporarily storing a clock select signal, which is input from the outside for selecting one of a plurality of clock signals different in phase from each other. The clock switching control circuit then outputs the clock select signal in accordance with the change in the level of a timing signal that switches the clock signals. A clock output circuit outputs one of the clock signals selected in accordance with the clock select signal. A masking circuit generates the timing signal while masking it to a preselected level by taking account of changes in the levels of the clock signals.

Also, in accordance with the present invention, clock switching circuitry includes a clock switching control circuit for temporarily storing a clock select signal, which is input from the outside for selecting one of a plurality of clock signals different in phase from each other, as a first clock select signal. The clock switching control circuit then outputs the first clock select signal as a second clock select signal in accordance with the change in the level of a timing signal that switches the clock signals. A clock output circuit outputs two of the clock signals respectively selected in accordance with the first clock select signal and second clock select signal. A masking circuit outputs a clock signal by masking to a preselected level a level lying in a phase error range in which the two clock signals selected change in level.

BRIEF DESCRIPTION OF THE DRAWINGS

The objects and features of the present invention will become more apparent from consideration of the following detailed description taken in conjunction with the accompanying drawings in which:

FIG. 9 is a timing chart representative of a specific operation of the alternative embodiment.

DESCRIPTION OF THE PREFERRED EMBODIMENTS

Figure 1:
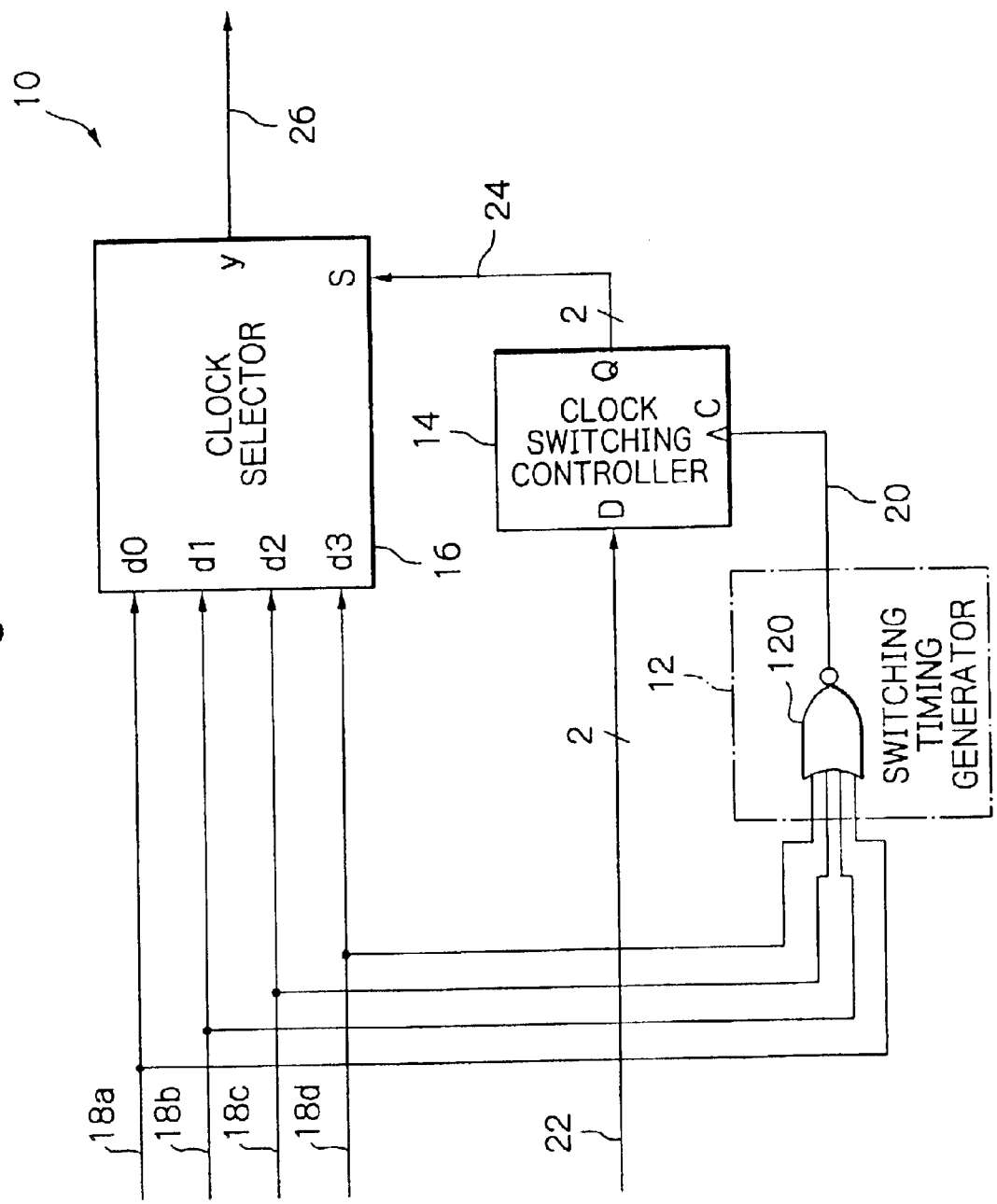
FIG. 1 is a schematic block diagram of clock switching circuitry embodying the present invention.

Referring to FIG. 1 of the drawings, clock switching circuitry embodying the present invention is generally designated by the reference numeral 10. It is to be noted that part of the clock switching circuitry 10 not directly relevant to the understanding of the present invention is neither shown nor will be described specifically. Signals are designated by reference numerals attached to connection lines on which they appear.

As shown, the clock switching circuitry 10 is generally made up of a switching timing generator 12, a clock switching controller 14, and a clock selector 16. Clock signals 18a, 18b, 18c and 18d different in phase from each other are input to the switching timing generator 12 from the outside of the circuitry 10. The switching timing generator 12 is implemented as a four-input NOR gate 120 configured to produce an OR of the input clock signals 18a through 18d, invert the OR, and then output the resulting inverted signal. In this sense, the switching timing generator 12 plays the role of a masking circuit. The output signal 20 of the NOR gate 120 is input to the clock switching controller 14. The switching timing generator 12 switches data at the negative-going edge of one of the input clock signals whose phase error is delayed more than the phase errors of the others, as will be described later more specifically.

The clock switching controller 14 is implemented as a two-bit data register. The output signal 20 of the switching timing controller 12 is input to the clock port C of the clock switching controller 14 as a clock signal. Also, a two-bit clock select signal 22 is fed from the outside of the circuitry 10 to the data input terminal D of the clock switching controller 14. In this condition, the clock switching controller 14 delivers two-bit data 24 stored in the register to the clock selector 16 via its data output terminal Q at the positive-going edge of the clock signal 20.

The clock selector 16 has four input ports d0, d1, d2 and d3 to which the clock signals 18a, 18b, 18c and 18d, respectively, are applied. The clock selector 16 selects one of the four clock signals 18a through 18d in accordance with the data 24 input via its select terminal S. The clock signal selected by the clock selector 16 is output from the circuitry 10 via the output terminal y of the clock selector 16 as a clock signal 26.

The clock signal 26 output from the circuitry 10 is used as a sampling clock signal with which a system including the circuitry 10 handles input data as sampled data synchronous to a clock, although not shown specifically in FIG. 1. In addition, the system uses the clock signal 26 as its system clock thereof It is to be noted that the clock signals 18a through 18d may have any suitable phase errors if the phase errors are not inverse in phase to each other, i.e., if they are not 180°.

Figure 2:
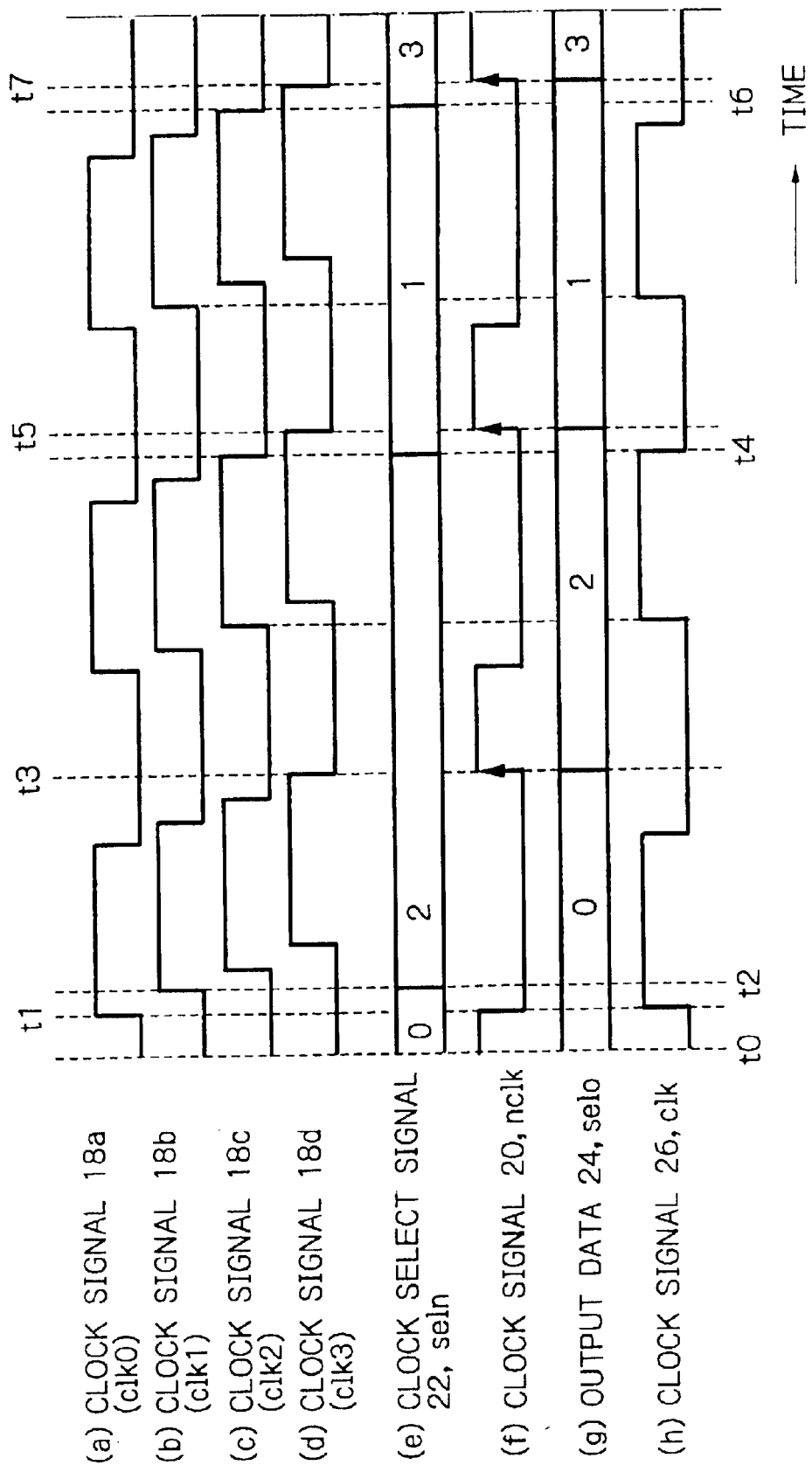
FIG. 2 is a timing chart useful for understanding a specific operation of the illustrative embodiment shown in FIG. 1.

Reference will be made to FIG. 2, for describing a specific operation of the clock switching circuitry 10. In FIG. 2, lines (a) through (h) show specific waveforms of the various signals and data appearing in the clock switching circuitry 10. As shown, the clock signals 18a (clk0), 18b (clk1), 18c (clk2) and 18d (clk3) are input to the clock switching circuitry 10. The clock signal clk3 is shown as having a phase error delayed more than the phase errors of the other clock signals clk0 through clk2. The clock switching circuitry 10 is operating in an asynchronous manner. FIG. 2(e) shows the two-bit clock select signal 22 (seln) input from the outside to the clock switching controller 14. In the specific operation, the clock switching controller 14 is reset to data "0 (zero)" by a reset signal, not shown, and held in the reset state up to a time t0.

While the initial data of the clock select signal 22 (seln) is assumed to be "0" in FIG. 2(e), it may have any other suitable fixed value, if desired.

So long as the data "0" is input in the reset state, all the clock signals clk0 through clk3 input to the switching timing generator 12 are representative of data "0". The switching timing generator 12 therefore continuously maintains the clock signal nclk, FIG. 2(f), in its high level. When the clock signal clk0 goes high at a time t1, the clock signal nclk goes low. In the illustrative embodiment, the clock select signal seln is expected to be switched in its active high level state. The clock switching controller 14 therefore does not switch the data, but continuously delivers the data "0" to the clock selector 16. It follows that the clock selector 16 selects the clock signal clk0 and outputs it as the clock signal clk, FIG. 2(h).

When the clock signal clk0 goes high at the time t1, the clock signal nclk output from the switching timing controller 12 goes low. The clock switching controller 14 continuously outputs the data "0" in its inactive state, so that the clock selector 16 outputs the clock signal clk0 designated by the data "0".

At a time t2, the clock select signal seln is fed to the clock switching controller 14 in order to command it to select data "2". However, the switch timing generator 12 does not make the switch timing active until a time t3 at which all the clock signals clk0 through clk3 go low. When the switch timing generator 12 goes high at the time t3, it causes the clock switching controller 14 to store the data "2" of the active, clock select signal seln. Subsequently, the clock switching controller 14 feeds data "2" to the clock selector 16 as the two-bit data selo, FIG. 2(g). In response, the clock selector 16 selects the clock signal clk2 as designated by the data "2" and outputs the waveform of the clock signal clk2.

At a time t4, the data of the clock select signal seln input to the clock switching controller 14 changes from "2" to "1". However, the clock signal nclk (20) output from the switch timing generator 12 is still in its low level, so that the clock selector 16 continuously selects and outputs the clock signal clk2.

At a time t5, the clock signal nclk (20) output from the switch timing generator 12 again goes high. At this instant, the clock switching controller 14 stores the data "1" of the clock select signal seln and then delivers it to the clock selector 16, causing the clock selector 16 to select and output the clock signal clk1.

At a time t6, the data of the clock select signal seln (22) changes from "1" to "3". However, the clock signal nclk (20) input from the switch timing generator 12 to the clock switching controller 14 is still in its low level, so that the clock switching controller 14 does not switch its output. As a result, the clock selector 16 continuously selects and outputs the clock signal clk1.

At a time t7, the clock signal nclk (20) output from the switching timing generator 12 goes high, causing the clock switching controller 14 to select the data "3" and store it. When the clock switching controller 14 feeds the data "3" to the clock selector 16, the clock selector 16 selects and outputs the clock clk3. The logical operation described above is repeated thereafter.

As stated above, the illustrative embodiment takes account of differences between the phase errors of the clock signals clk0 through clk3 and switches the data at the time when the clock signal clk3 delayed most goes low. This successfully prevents unnecessary clock signals from being output during sampling of single data, i.e., accurately outputs a desired clock signal. Further, the illustrative embodiment can perform such accurate clock signal switching with a minimum number of structural parts, i.e., a single clock selector and the addition of a NOR gate.

Figure 3:
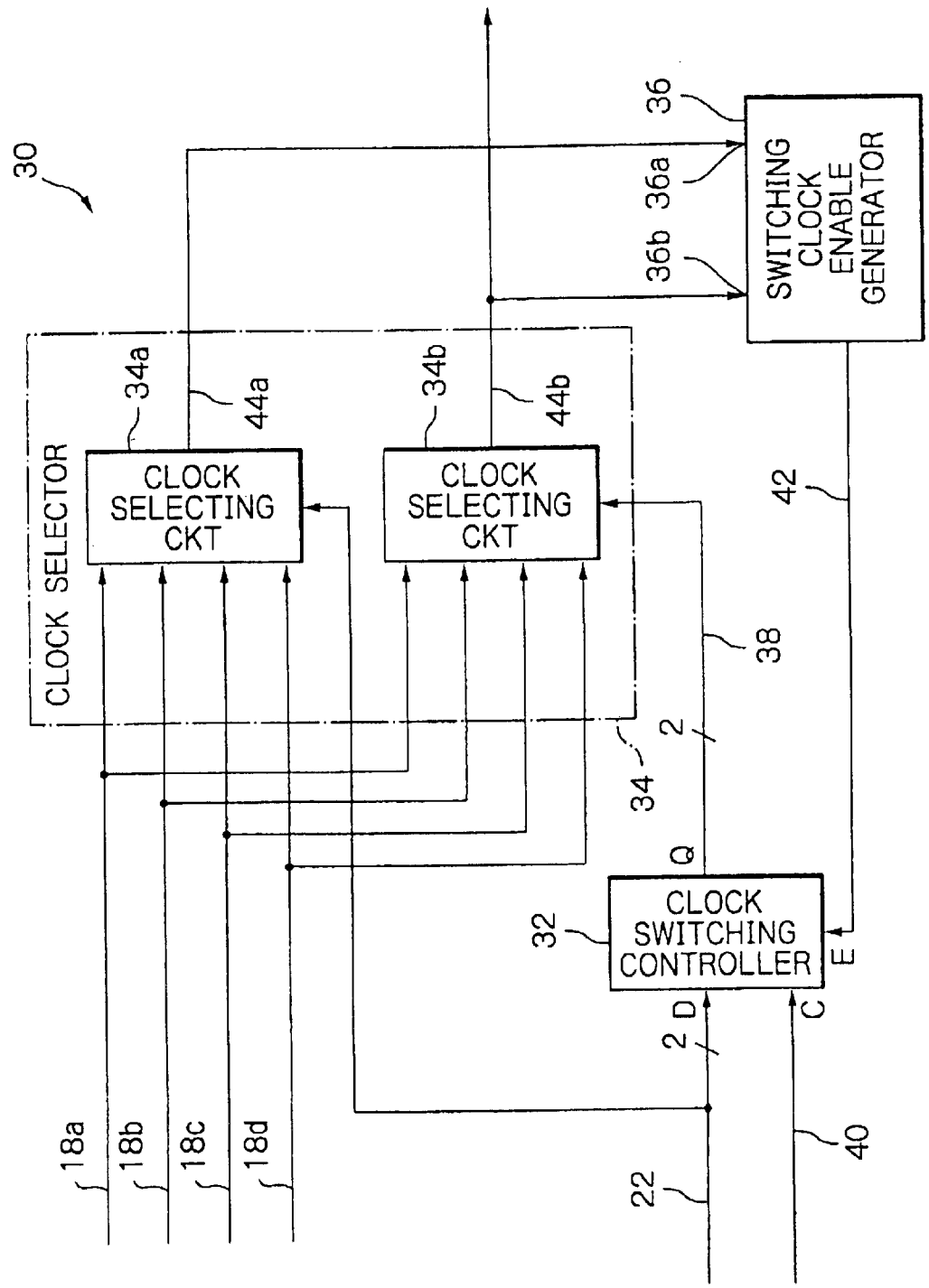
FIG. 3 is a schematic block diagram showing conventional clock switching circuitry.

To better understand the above advantages of the illustrative embodiment, a conventional clock switching circuitry will be described with reference to FIG. 3. As shown, the conventional clock switching circuitry, generally 30, receives the clock signals 18a through 18d and clock select signal 22 from the outside. The clock switching circuitry 30 is generally made up of a clock switching controller 32, a clock selector 34, and a switching clock enable generator 36.

The clock switching controller 32 is a register having a synchronizing function. In the circuitry 30, the clock switching controller 32 receives a high-speed clock signal 40 for synchronization from the outside and receives an enable signal 42 from the switching clock enable generator 36. The phase errors of the clock signals 18a through 18d each are an integral multiple of one period of the high-speed clock 40. While the enable signal 42 output from the switching clock enable generator 36 is in its high level, the clock switching controller 32 stores the data of the clock select signal 22 at the positive-going edge of the high-speed clock 40 and delivers the data to the clock selector 34.

The clock selector 34 includes two clock selecting circuits 34a and 34b to both of which the clock signals 18a through 18d are applied. The clock selecting circuits 34a and 34b each selects one of the clocks 18a through 18d in accordance with a particular data value input thereto. More specifically, the clock selecting circuit 34a selects one of the clock signals 18a through 18d in response to the clock select signal 22 and produces the clock signal selected as an output 44a. The clock signal 44a (clkn) is input to one end 36a of the switching clock enable generator 36. The other clock selecting circuit 34b selects one of the clock signals 18a through 18d in response to an enable select signal 38 fed from the clock switching controller 32 and produces the clock signal selected as an output 44b. The clock signal 44b (clko) is fed to the other input 36b of the switching clock enable generator 36 and is output as a corrected clock signal from the clock switching circuitry 30.

The switching clock enable generator 36 includes an ExNOR (Exclusive NOR) gate although not shown specifically. The ExNOR gate detects a data switching position on the basis of the input clock signals 44a and 44b, generates the enable signal 42 in accordance with the detected data switching position, and delivers the enable signal 42 to the enable terminal E of the clock switching controller 32. While the enable signal 42 is in its high level, the clock switching controller 32 switches the enable signal 38 at the positive-going edges of the high-speed clock 40 input to its clock terminal C, as will be described specifically hereinafter.

Figure 4:
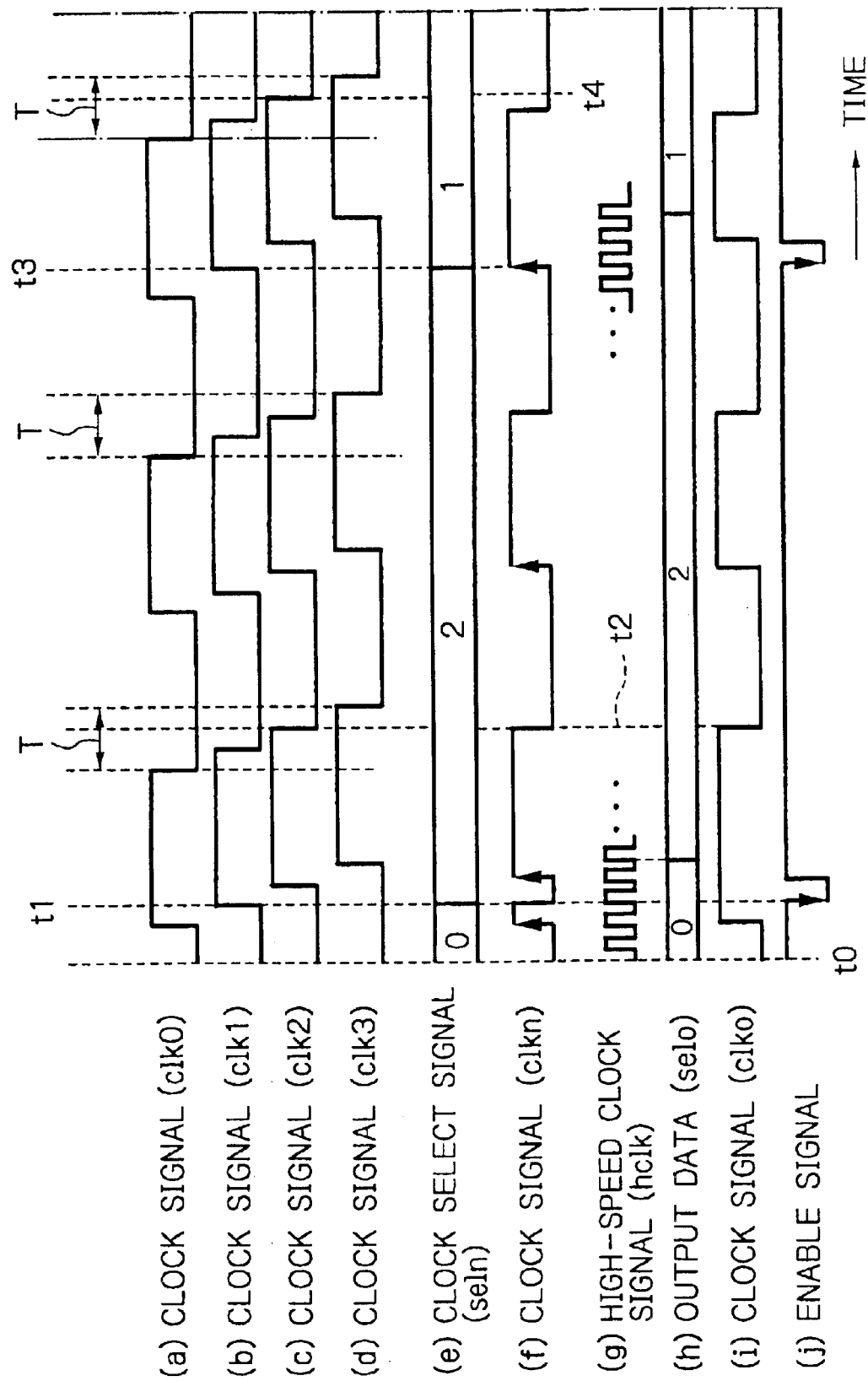
FIG. 4 is a timing chart with a specific operation of the conventional clock switching circuitry.

Reference will be made to FIG. 4 for describing the operation of the conventional clock switching circuitry 30. In FIG. 4, lines (a) through (j) show specific wave forms of the various signals and data described with reference to FIG. 3. As shown, assume that after the clock selecting circuit 34a has sampled one data, the data of the clock select signal 22 (seln; FIG. 4(e)) changes. Then, the clock selecting circuit 34a outputs the clock signal 18c (clk2; FIG. 4(c)) as an unnecessary clock signal. If this clock signal clk2 is used as a clock signal, then the same signal is sampled two times, i.e., one additional data is needlessly output (double sampling). Consequently, it is likely that the data is shifted from a preselected format.

To obviate the double sampling mentioned above, the other clock selecting circuit 34b outputs the clock signal 44b (clko; FIG. 4(i)) in accordance with the output 38 of the clock switching controller 32.

The clock switching controller 32 inputs the clock select signal seln (22) or outputs the enable select signal 38 at the positive-going edge of the high-speed clock signal 40 (hclk; FIG. 4(g)) after the switchover of the clock signal. To see how the clock select signal seln has been switched before the above timing, the switching clock enable generator 36 detects a data switching timing on the basis of the clock signals clkn and clko. Subsequently, the switching clock enable generator 36 delivers the resulting EXNOR or enable signal 42 (FIG. 4(j)) to the clock switching controller 32.

The clock switching controller 32 determines that the time when the enable signal 42 has gone high is the beginning of an enable period. During the enable period, the clock switching controller 32 stores the clock select signal seln (22) at the first positive-going edge of the high-speed clock hclk and feeds the clock selector 34b with the input data selo (38).

As stated above, to implement accurate clock switching, the conventional clock switching circuitry 30 needs two clock selecting circuits 34a and 34b as well as the switching clock enable generator 36 and high-speed clock 40. By contrast, the illustrative embodiment is practicable with a single clock selector and can output a clock signal accurately following phase errors without resorting to the high-speed clock 40.

Figure 5:
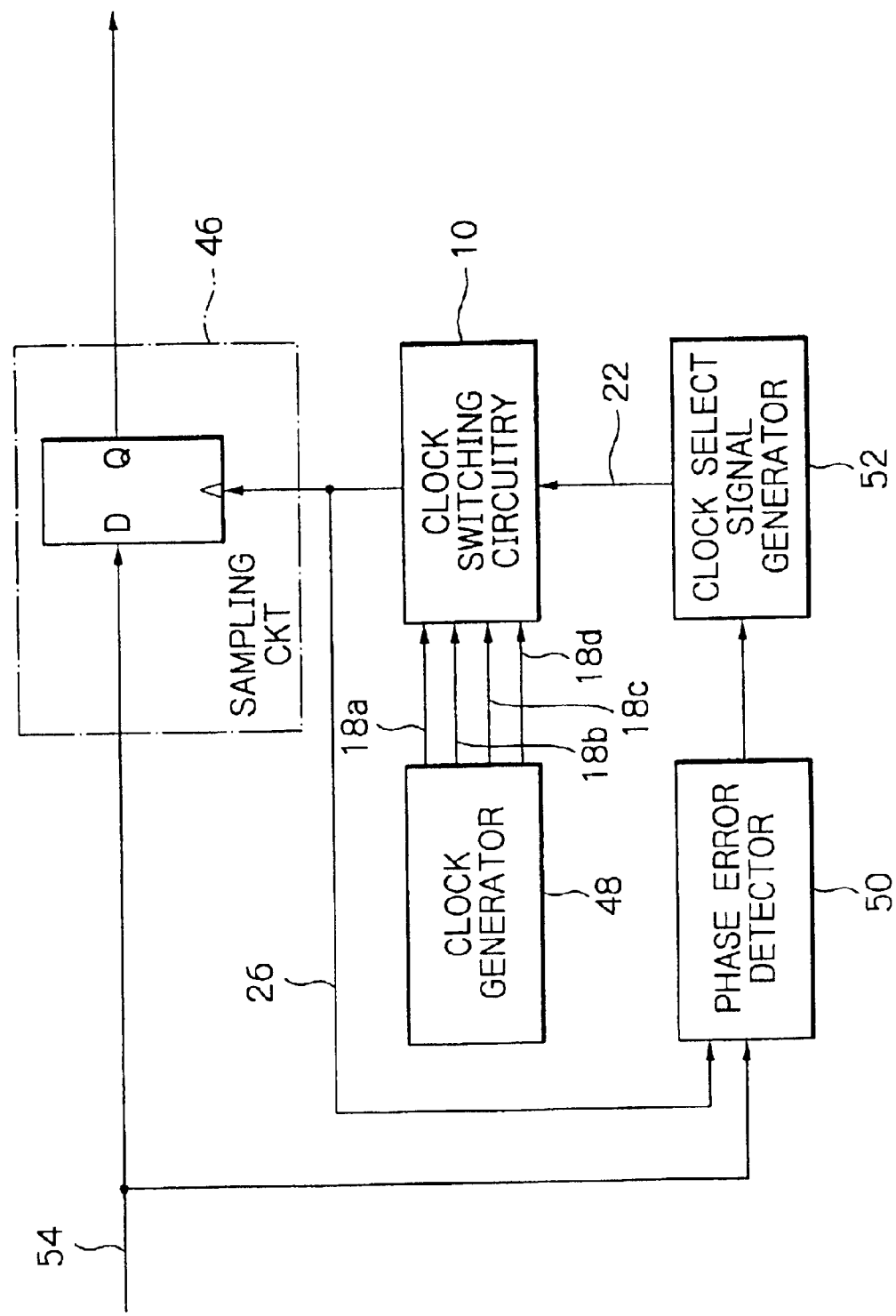
FIG. 5 is a schematic block diagram of a specific system including the illustrative embodiment.

FIG. 5 shows a specific system to which the clock switching circuitry 10 of the illustrative embodiment is applied. In the specific system, the clock switching circuitry 10 is positioned at the last stage of clock feeding circuitry that feeds a clock signal by taking account of clock phase errors. The clock signal output from the circuitry is used to provide a sampling circuit 46, which samples input data, with a sampling timing. The sampling circuit 46 may be implemented by a flip-flop circuit or a register by way of example.

As shown in FIG. 5, the system includes a clock generator 48, a phase error detector 50, and a clock select signal generator 52 in addition to the clock switching circuitry 10. The clock generator 48 generates the clock signals 18*a* through 18*d* while feeding them to the clock switching circuitry 10. The clock signals 18*a* through 18*d* each has a particular phase error that may be equal to an integral multiple of a preselected amount or any desired value other than 180°, as stated earlier. The clock generator 48 may include a PLL circuit in order to output accurate clock signals.

Data 54 input to the system and the clock signal 26 output from the clock switching circuitry 10 are fed to the phase error detector 50. The phase error detector 50 detects a difference between the phase of the data 54 and that of the clock signal 26 as an error and feeds a phase error signal representative of the error to the clock select signal generator 52.

The clock select signal generator 52 generates the two-bit data 22 (seln) indicative of a select position where a clock signal corresponding to the size of the phase error is to be fed. The two-bit data is input to the clock switching circuitry 10 so as to allow the circuitry 10 to select one of the clock signals 18*a* through 18*d*.

Figure 6:
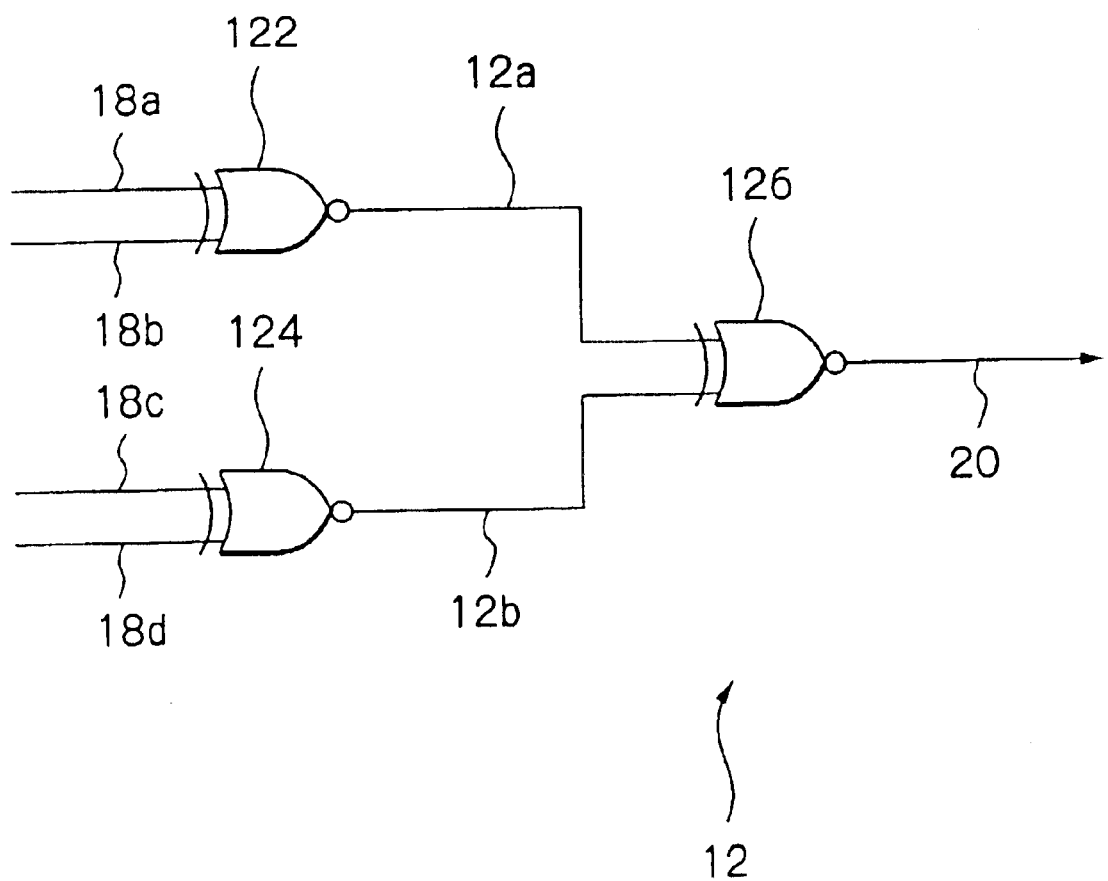
FIG. 6 is a circuit diagram showing a modification of the illustrative embodiment.

A modification of the switching timing generator or masking circuit 12 shown in FIG. 1 will be described with reference to FIG. 6. As shown, the switching timing generator 12 includes three ExNOR gates 122, 124 and 126. The clock signals 18*a* and 18*b* are fed to the ExNOR gate 122 while the clock signals 18*c* and 18*d* are fed to the ExNOR gate 124. Signals 12*a* and 12*b* output from the EXNOR gates 122 and 124, respectively, are input to the EXNOR gate 126. The ExNOR gate 126 delivers the clock signal 20 (nclk) to the clock switching controller 14, FIG. 1. The crux is that assuming that the number of the clock signals is n (natural number), then a masking circuit has n−1 two-input gates configured to invert the exclusive OR for thereby feeding the timing signal to a clock output circuit.

Figure 7:
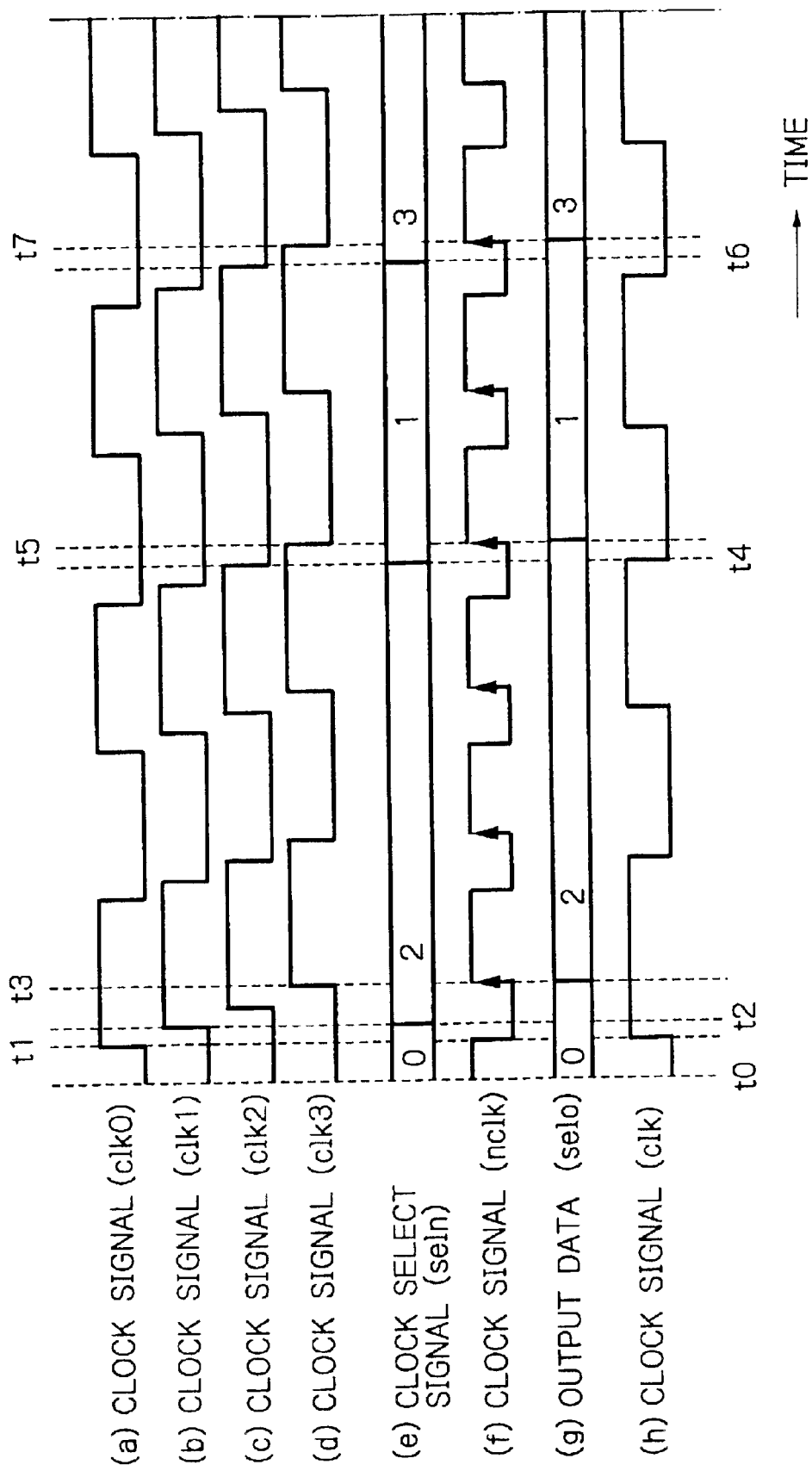
FIG. 7 is a timing chart useful for understanding a specific operation of the modification shown in FIG. 6.

Reference will be made to FIG. 7 for describing a specific operation of the modification shown in FIG. 6. In FIG. 7, lines (a) through (d) show the four clock signals clk0 through clk3, respectively. As shown in FIG. 7(*e*), the data of the clock select signal seln (22) changes from "0" to "2" at a time t2, changes from "2" to "1" at a time t4, and changes from "1" to "3" at a time t6.

As shown in FIG. 7(*f*), the clock signal nclk (20) output from the switching timing generator 12 remains in its high level up to a time t1 because all the clock signals clk0 through clk3 are in its low level. In this condition, as shown in FIG. 7(*g*), the clock switching controller 14 simply outputs the data "0" of the clock select signal seln fed thereto as output data selo. The clock selector 16 therefore selects the clock signal clk0, which remains in its low level up to the time t1.

When the clock signal clk0 goes high at the time t1, the clock signal nclk goes low, but the clock switching controller 14 does not switch its output selo because it is in its active high level. Even when the data of the clock select signal seln changes from "0" to "2" at the time t2, the output selo of the clock switching controller 14 remains the data "0" because the clock signal nclk is in its low level.

The clock signal clk3 goes high at a time t3. At this time, the clock switching controller 14 takes in the data "2" of the clock select signal seln and produces output data selo "2". As a result, the clock selector 16 starts outputting the clock signal clk2 at the time t3. In this manner, the switching timing generator 12 switches the data at the time when the clock signal clk3 having the phase error delayed most goes high.

At the time t4, the data of the clock select signal seln changes from "2" to "1", but such a change is not reflected by the selection of the clock signal because the clock signal nclk is in its low level. At a time t5, the clock signal nclk goes high and causes the clock selector 16 to select and output the clock signal clk1 designated by the data "1".

At the time t6, the data of the clock select signal seln changes from "1" to "3", but the clock switching controller 14 does not take in the data "1" up to a time t7. When the clock signal nclk goes high at the time t7, the clock selector 16 selects the clock signal clk3 and continuously outputs it until the data of the clock select signal seln changes.

As stated above, the modification, like the illustrative embodiment, can accurately switch the clock signals clk0 through clk3 with a minimum number of parts including a masking circuit and without resorting to an enable signal or a high-speed clock signal (hclk, FIG. 4(*g*)). Further, switchover to a corrected clock signal is effected within half a period of the clock signal selected, so that the switchover can be seen on the basis of the position where the output data selo has been switched. This successfully reduces the synchronizing time and thereby allows the clock switching circuitry to accurately follow the sampling and other processing of the system, insuring the stable operation of the system.

Figure 8:
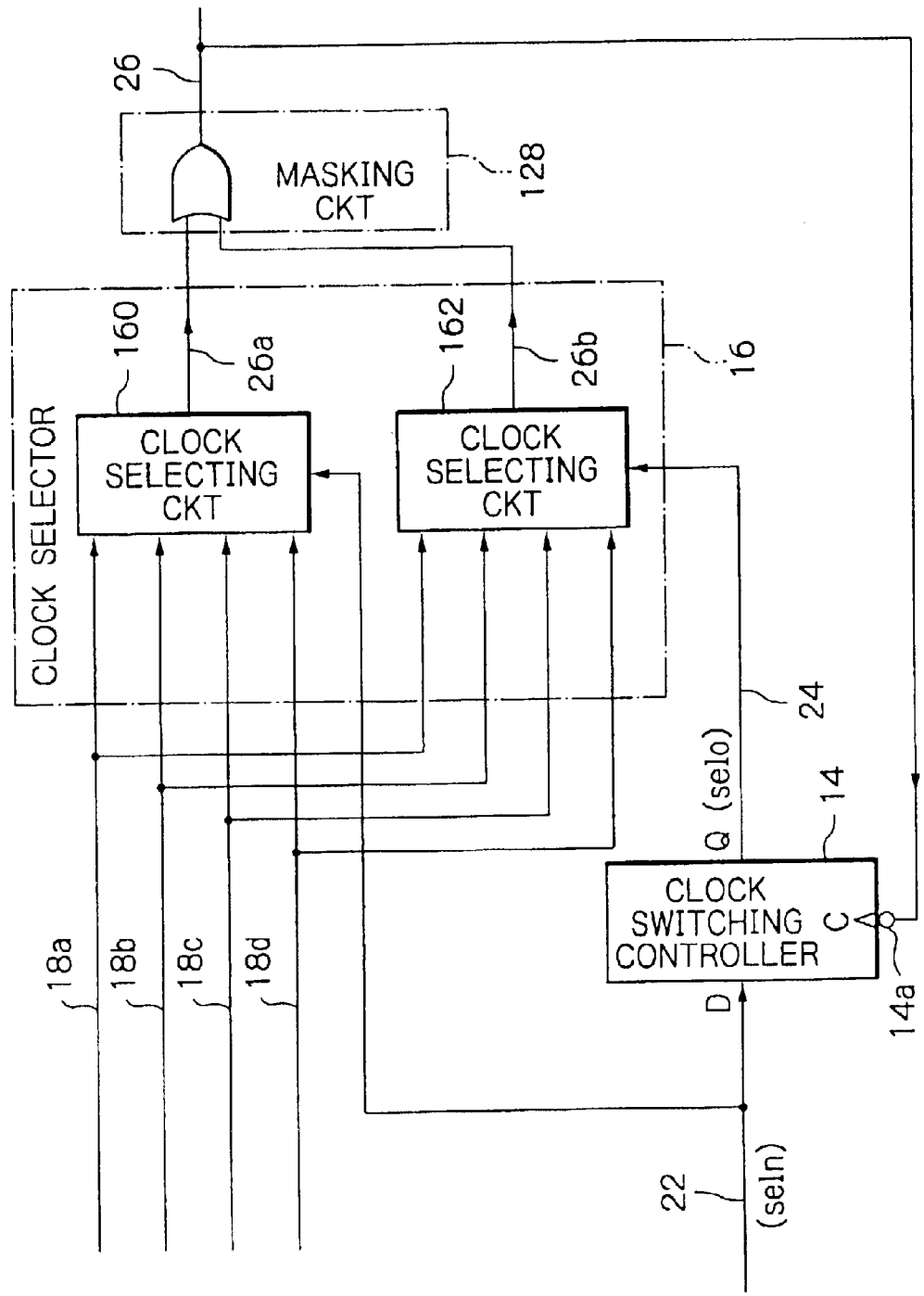
FIG. 8 is a schematic block diagram showing an alternative embodiment of the present invention.

Referring to FIG. 8, an alternative embodiment of the clock switching circuitry in accordance with the present invention will be described. As shown, the clock switching circuitry is generally made up of the clock switching controller 14, the clock selector 16, and a masking circuit 128. The clock switching controller 14 includes a register or a flip-flop circuit as in the previous embodiment. An inverter 14*a* is connected to the clock terminal C of the clock switching controller 14, so that the controller 14 takes in data at the negative-going edges of the clock signal.

The clock selector 16 includes two clock selecting circuits 160 and 162. The clock selecting circuit 160 selects one of the clock signals 18*a* through 18*d* designated by the clock select signal or data 22 (seln) and feeds it to one input of the masking circuit 128 as a clock signal 26*a*. The clock selecting circuit 162 selects one of the clock signals 18*a* through 18*d* designated by the data 24 (selo) output from the clock switching controller 14 and feeds it to the other input of the masking circuit 128 as a clock signal 26*b*.

The masking circuit 128 includes an OR gate for producing an OR of the input clock signals 26*a* and 26*b*. When the clock signals 26*a* and 26*b* are different in level from each other, the masking circuit 128 masks one of the clock signals in its low level with a signal in its high level. The masking circuit 128 outputs the masked signal as a clock signal 26 while feeding it to the clock switching controller 14 via the inverter 14*a*.

The operation of the illustrative embodiment will be described with reference to FIG. 9. In FIG. 9, lines (a) through (d), show the clock signals clk0 through clk3, respectively, different in phase from each other. FIG. 9(e) shows how the data of the clock select signal seln changes specifically. As shown, at a time t0, the data "0" of the clock select signal seln is being fed to the clock switching controller 14. The clock switching controller 14 stores and outputs the above data at the positive-going edge of the clock signal 26 input to its clock terminal C.

The data of the clock select signal seln is "0" from the time t0 to a time t1, so that the clock selecting circuit 160 outputs the waveform of the clock signal clk0 as a clock signal clkn. During this period of time, the clock signal clkn input to the masking circuit 128 goes high, as shown in FIG. 9(f). At this instant, the clock switching controller 14 feeds the data "0" input thereto to the clock selector 162 as output data selo, FIG. 9(g). The clock selector 162 therefore selects and outputs the clock signal clk0, FIG. 9(h).

When the data of the clock select signal seln changes from "0" to "2" at the time t1, the clock selector 160 selects and outputs the clock signal clk2 immediately. At this stage of operation, a negative-going timing signal is not input to the clock switching controller 14. The clock switching controller 14 therefore continuously outputs the data "0" up to a time t2, causing the clock selector 162 to output the clock signal clko. The masking circuit 128, which produces an OR of the clock signals clkn (26a) and clko (26b), holds its output in its high level up to the time t2. This successfully prevents a single data from being sampled two times, as shown in FIG. 9(f).

At a time t2, the OR of the clock signals clkn and clko goes low, FIG. 9(i). As a result, the clock switching controller 14 stores and outputs data "2", FIG. 9(g). At a time t3, the clock selector 160 selects and outputs the clock signal clk1 designated by the data "1" of the clock select signal seln. On the other hand, the clock switching controller 14 continuously outputs the data "2" because a negative-going signal is not input thereto. Consequently, the clock selecting circuits 160 and 162 respectively deliver a high and a low level to the masking circuit 128. In response, the masking circuit 128 causes the clock signal clk to go high and remain in its high level up to a time t4, as shown in FIG. 9(i). At the time t4, the clock signal clk2 goes low with the result that the clock switching controller 14 stores new data "1" while feeding it to the clock selector 162.

It is to be noted that a time interval T shown in FIG. 9 is representative of the sum of the phase errors of the four clock signals clk0 through clk3.

As shown in FIG. 9(f), when the data of the clock select signal changes after the sampling of one data, an unnecessary positive-going edge does not appear in the output clock signal. This insures a stable clock signal.

Assume that the data of the clock select signal changes from "2" to "1" smaller than "2" in order to advance the phase of the clock signal, and that the clock signal clk being output is in its low level. Then, if the clock signal designated by the data of the clock select signal is in its high level, a clock signal reflecting the timing of the designated clock signal can be output. In this case, the ability to follow system operations derived from the correction of the phase errors is enhanced to the utmost degree.

As stated above, in the illustrative embodiment, a switching timing generating section is substituted for a switching clock enable generator and a high-speed clock included in the convention clock switching circuitry. The illustrative embodiment can therefore selectively output clock signals of different phases with a simple circuit arrangement and contributes a great deal to the size reduction of an apparatus to which the clock switching circuitry is applied. Particularly, a clock selecting section can surely switch the clock signals without sampling the same data two times even when it includes a single clock selecting circuit.

Further, the illustrative embodiment, which does not need the switch clock enable generator or the high-speed clock, is practicable with a minimum number of parts for signal generation. Moreover, the illustrative embodiment can accurately output a desired clock signal with a simple masking section positioned at the last stage of clock output circuitry, further contributing to the size reduction of an apparatus to which the clock switching circuitry is applied.

The entire disclosure of Japanese patent application No. 2002-004067 filed on Jan. 11, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. Clock switching circuitry for jitter reduction comprising:

a clock switching control circuit which temporarily stores an externally input first clock select signal and which outputs a corresponding second clock select signal in accordance with a change in a level of a timing signal;

a clock output circuit which receives a plurality of clock signals which are shifted in phase relative to one another and which outputs two of the plurality of clock signals in accordance with the first clock select signal and the second clock select signal, respectively; and a masking circuit which receives the selected two of the plurality of clock signals and which outputs an output clock signal, wherein the output clock signal has a level in a phase error range defined by level changes of the selected two of the plurality of clock signals, and wherein the output clock signal is fed back as the timing signal to the clock switching control circuit.

2. The circuitry in accordance with claim 1, wherein said clock output circuit comprises:

a first clock selecting circuit for selecting and outputting one of the plurality of clock signals in response to the first clock select signal; and a second clock selecting circuit for selecting one of the plurality of clock signals in accordance with the second clock select signal; and wherein said masking circuit comprises logical OR gate circuitry which outputs the logical OR of the selected two of the plurality of clock signals as the output clock signal.

3. The circuitry in accordance with claim 1, wherein each of the plurality of clock signals has a particular desired phase error.

4. The circuitry in accordance with claim 2, wherein each of the plurality of clock signals has a particular desired phase error.

* * * * *